United States Patent
Kozaru et al.

[11] Patent Number: 5,841,961
[45] Date of Patent: Nov. 24, 1998

[54] SEMICONDUCTOR MEMORY DEVICE INCLUDING A TAG MEMORY

[75] Inventors: Kunihiko Kozaru; Tomohisa Wada; Hirotoshi Sato, all of Hyogo, Japan

[73] Assignee: Mitsubishi Denki Kabushiki Kaisha, Tokyo, Japan

[21] Appl. No.: 487,214

[22] Filed: Jun. 7, 1995

[30] Foreign Application Priority Data

Jul. 14, 1994 [JP] Japan .................................. 6-162267

[51] Int. Cl.⁶ .......................... G06F 11/00; G06F 11/16
[52] U.S. Cl. .................................. 395/182.03; 371/21.1; 365/200; 365/201
[58] Field of Search ........................ 395/182.03, 183.01, 395/183.06, 183.18, 184.01, 185.01, 185.06, 185.07; 365/201, 200; 371/21.1, 21.2, 22.5, 22.6

[56] References Cited

U.S. PATENT DOCUMENTS

| | | | |
|---|---|---|---|
| 4,117,545 | 9/1978 | Inadachi | 365/207 |
| 4,740,971 | 4/1988 | Tam et al. | 371/51.1 |
| 4,912,695 | 3/1990 | Senshu | 371/40.4 |
| 5,019,971 | 5/1991 | Lefsky et al. | 364/200 |
| 5,058,071 | 10/1991 | Kohda et al. | 365/125 |
| 5,067,131 | 11/1991 | Odaka et al. | 371/40.1 |
| 5,146,429 | 9/1992 | Kawai et al. | 365/200 |
| 5,170,400 | 12/1992 | Dotson | 371/37.4 |
| 5,195,096 | 3/1993 | Moore | 371/21.1 |
| 5,226,009 | 7/1993 | Arimoto | 365/189 |
| 5,270,975 | 12/1993 | McAdams | 365/200 |
| 5,276,834 | 1/1994 | Mauritz et al. | 395/425 |
| 5,313,425 | 5/1994 | Lee et al. | 365/201 |
| 5,349,556 | 9/1994 | Lee | 365/200 |
| 5,359,560 | 10/1994 | Suh et al. | 365/200 |
| 5,390,176 | 2/1995 | Schoute et al. | 370/60.1 |

FOREIGN PATENT DOCUMENTS 3-8200  1/1991  Japan .

*Primary Examiner*—Hoa T. Nguyen
*Attorney, Agent, or Firm*—Lowe, Price, LeBlanc & Becker

[57] ABSTRACT

In repairing a defective memory cell of a data memory placed in a data memory region, a repairing circuit which employs a repairing method causing some access penalty but having high repairing efficiency is located in a redundant row region and a redundant column region in the data memory region. On the other hand, in repairing a defective memory cell of a tag memory placed in a tag memory region, a repairing circuit which employs a repairing method having low repairing efficiency but causing little access penalty is located in a redundant column region in the tag memory region. Accordingly, optimal repair of a defective memory cell can be achieved according to respective functions of the tag memory and the data memory.

13 Claims, 14 Drawing Sheets

SEMICONDUCTOR MEMORY DEVICE INCLUDING A TAG MEMORY

BACKGROUND OF THE INVENTION

1. Field of the Invention

The present invention relates to a semiconductor memory device, and more particularly, to a cache memory including a tag memory.

2. Description of the Background Art

The following is the description of a conventional semiconductor memory device, a cache memory in conjunction with the accompanying drawings. First, a hierarchical structure of a conventional memory is described. FIG. 14 is a diagram showing the hierarchical structure of the conventional memory. A CPU (Central Processing Unit) 201 is connected to a cache memory 202. Cache memory 202 is connected to a main memory unit 203. The structure shown in FIG. 14 is made for improving the overall performance of a system. More specifically, only a portion which is accessed most frequently in a program is copied from the main memory unit into the cache memory, which is a high speed memory with a relatively small memory capacity, located near CPU 201. A technique to hierarchize a memory as described above is used in general to reduce average memory access time.

FIG. 15 is a diagram schematically showing a conventional cache memory. Referring to FIG. 15, cache memory 202 includes a tag memory region 204 and a data memory region 205. A data memory for copying and storing a portion of data in main memory unit 203 is formed in data memory region 205. A tag memory for storing a portion of addresses of data in the data memory is formed in tag memory region 204.

Operation of the cache memory will now be described. FIG. 16 is a diagram showing a logical structure of the conventional cache memory.

Referring to FIG. 16, the cache memory includes a status valid bit region 206, a tag memory region 207, a data memory region 208, and a comparison logic circuit 210.

An address bit train 214 which is applied externally into the cache memory includes a most significant tag portion 215 (for example, 16 bits), an intermediate index portion 216 (for example, 12 bits), and a least significant offset portion 217 (for example, 4 bits). An entry 209 which indicates a location of data in the cache memory to be accessed is determined uniquely by index portion 216. In other words, 12-bit index portion 216 corresponds to the number of entries 209. Accordingly, there are 4096 entries 209 in this case.

When address bit train 214 is applied externally, first, a bit train of index portion 216 is decoded and one of 4096 entries 209 is selected. Then, data (for example, 128 bits) of data memory region 208, tag data TD (for example, 16 bits) of tag memory region 207, and status valid bit data SV (for example, 1 bit) of status valid bit region 206 in the selected entry are read out. Tag data TD and status valid bit data SV which have been read out are input to comparison logic circuit 210. Data ATD of tag portion 215 in address bit column 214 is also input to comparison logic circuit 210. Comparison logic circuit 210 includes a comparison circuit 211 and an AND circuit 213. Comparison circuit 211 compares read out tag data TD with data ATD of tag portion 215 in address bit train 214, and outputs a resultant data to AND circuit 213. Status valid bit data SV is input to AND circuit 213, and a logical product of the resultant data and status valid bit data SV is output therefrom as a hit signal HIT or a miss signal MISS. More specifically, comparison logic circuit 210 outputs a hit signal HIT externally only when tag data TD and data ATD of tag portion 215 match and status valid bit data SV is valid, indicating that externally output data DATA is correct. Comparison logic circuit 210 outputs a miss signal MISS externally when status valid bit data SV is invalid, indicating that externally output data DATA is invalid.

A memory region of the cache memory shown in FIG. 16 will now be described in more detail. FIG. 17 is a diagram showing an arrangement of a memory block constituting a memory region of the cache memory shown in FIG. 16. In fact, a memory region of the cache memory shown in FIG. 16 is constituted by combination of a plurality of memory blocks, one of which is shown in FIG. 17.

Referring to FIG. 17, a memory block includes a plurality of memory cells MC located in a matrix form in row and column directions, word lines R1–Rn for selecting a row direction, complementary bit line pairs C1–Cn to which memory cells MC are connected, a multiplexer 223, a bit line peripheral circuit 222, a row decoder 221, and a column decoder 224.

A memory cell MC stores 1-bit of information. Row decoder 221 selects one of the word lines R1–Rn in response to an externally input command to select a memory cell MC. All the memory cells MC connected to the selected word line are activated to be ready for reading/writing data. Column decoder 224 selects one of the plurality of bit line pairs C1–Cn in response to an externally input command to select a memory cell MC.

In a conventional cache memory, a tag memory generally has smaller memory capacity than a data memory, and in the cache memory shown in FIG. 3, for example, a tag memory has ⅛ memory capacity of a data memory. Accordingly, in the case of a cache memory including a tag memory in which the cache memory itself has relatively small memory capacity, since few defective memory cells are produced in a tag memory region, repair of a defective portion in a tag memory region by a redundant circuit has not been carried out generally.

However, in the case of a cache memory having large memory capacity, more defects are produced in a tag memory region than in a cache memory having small memory capacity. Therefore, if a defective portion is not repaired by a redundant circuit, yield of a cache memory is reduced. Consequently, with increase in memory capacity of a cache memory, repair of a defective portion in a tag memory region by a redundant circuit has been required also in a cache memory including a tag memory.

On the other hand, a data memory generally has large memory capacity, and more defects are produced in a data memory than in a tag memory. Accordingly, larger degree of freedom in repairing defects in a data memory by a redundant circuit is desired. For example, it is desirable to repair a defective memory cell in one memory block with a redundant memory cell in another memory block. However, in general, if degree of freedom in repairing defects by a redundant circuit is large, access penalty caused by defect repair is increased (access time at the time of defect repair becomes longer than normal access time). Therefore, when a repairing method similar to that used in a data memory is applied to a tag memory as described above, access time to a tag memory, which is required to be shorter than that to a data memory, becomes longer. Consequently, in a conventional cache memory in which the same repairing method is used in different memories, optimal repair of a defective memory cell cannot be carried out for each memory.

SUMMARY OF THE INVENTION

It is an object of the present invention to provide a semiconductor memory device capable of carrying out optimal repair of a defective memory cell for each memory.

It is another object of the present invention to provide a semiconductor memory device capable of improving yield of a tag memory, and furthermore, yield of a cache memory without making longer the access time to a tag memory than access time to a data memory in a cache memory including a tag memory.

A semiconductor memory device in accordance with one aspect of the present invention includes first and second memories which are integrated on the same chip and have different functions, the first memory including a first repairing circuit for repairing a defective memory cell by a first repairing method, and the second memory including a second repairing circuit for repairing a defective memory cell by a second repairing method which is different from the first repairing method.

Since a semiconductor memory device having the above described structure includes first and second redundant repairing circuits employing different repairing methods for first and second memories, respectively, a defective memory cell can be repaired by a repairing method according to a function of each memory.

A semiconductor memory device in accordance with another aspect of the present invention includes first and second memories which are integrated on the same chip and have different functions, the first memory including a plurality of first memory cells, and the second memory including a plurality of second memory cells which are different from the first memory cell.

Since a semiconductor memory device having the above described structure includes first and second memory cells which are different from each other for first and second memories, respectively, a desired memory cell can be provided according to a function of each memory. As a result, optimal repair of a defective memory cell can be achieved for each memory.

A semiconductor memory device in accordance with a further aspect of the present invention includes first and second memories which are integrated on the same chip and have different functions, the first memory including a plurality of first memory cells, and the second memory including a plurality of second memory cells having different memory size from the first memory cell.

Since a semiconductor memory device having the above described structure includes first and second memory cells which are different in memory size from each other for first and second memories, respectively, memory size can be determined according to a function of each memory. As a result, optimal repair of a defective memory cell can be achieved for each memory.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
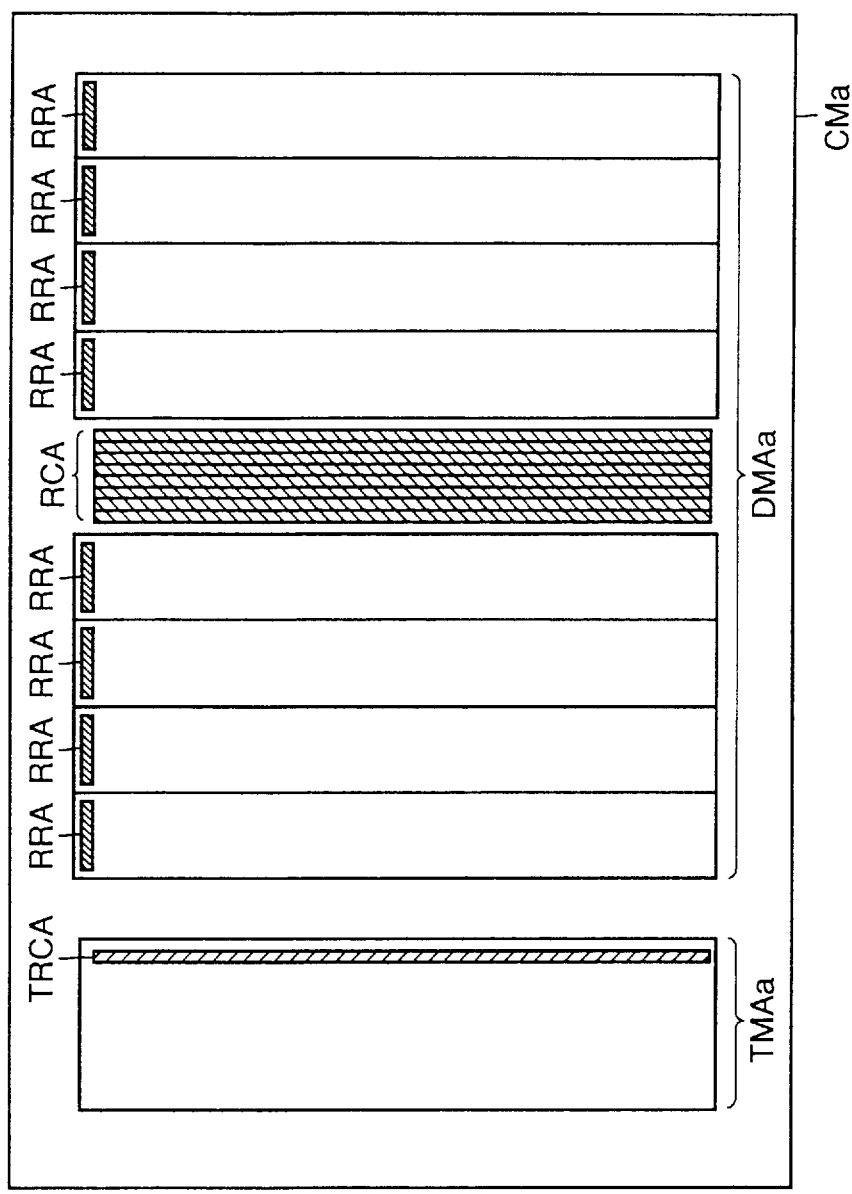
FIG. 1 is a schematic diagram showing an arrangement of a semiconductor memory device in accordance with a first embodiment of the present invention.

A cache memory of a semiconductor memory device in accordance with a first embodiment of the present invention will now be described in conjunction with the accompanying drawings. FIG. 1 is a schematic diagram showing an arrangement of a semiconductor memory device in accordance with the first embodiment of the present invention.

Referring to FIG. 1, a cache memory CMa includes a tag memory region TMAa and a data memory region DMAa. Tag memory region TMAa includes a redundant column region TRCA. Data memory region DMAa includes a redundant row region RRA and a redundant column region RCA.

Redundant column region TRCA is located in a column direction of tag memory region DMAa. A column repairing circuit for repairing a defective memory cell in a tag memory is placed in redundant column region TRCA.

Data memory region DMAa is divided into eight blocks, and redundant row region RRA is placed for each block. Redundant column region RCA is placed in the center of eight blocks, that is, between four blocks in the right and four blocks in the left. Redundant row region RRA is located in a row direction of each block. Redundant column region RCA is located in a column direction of data memory region DMAa.

Figure 2:
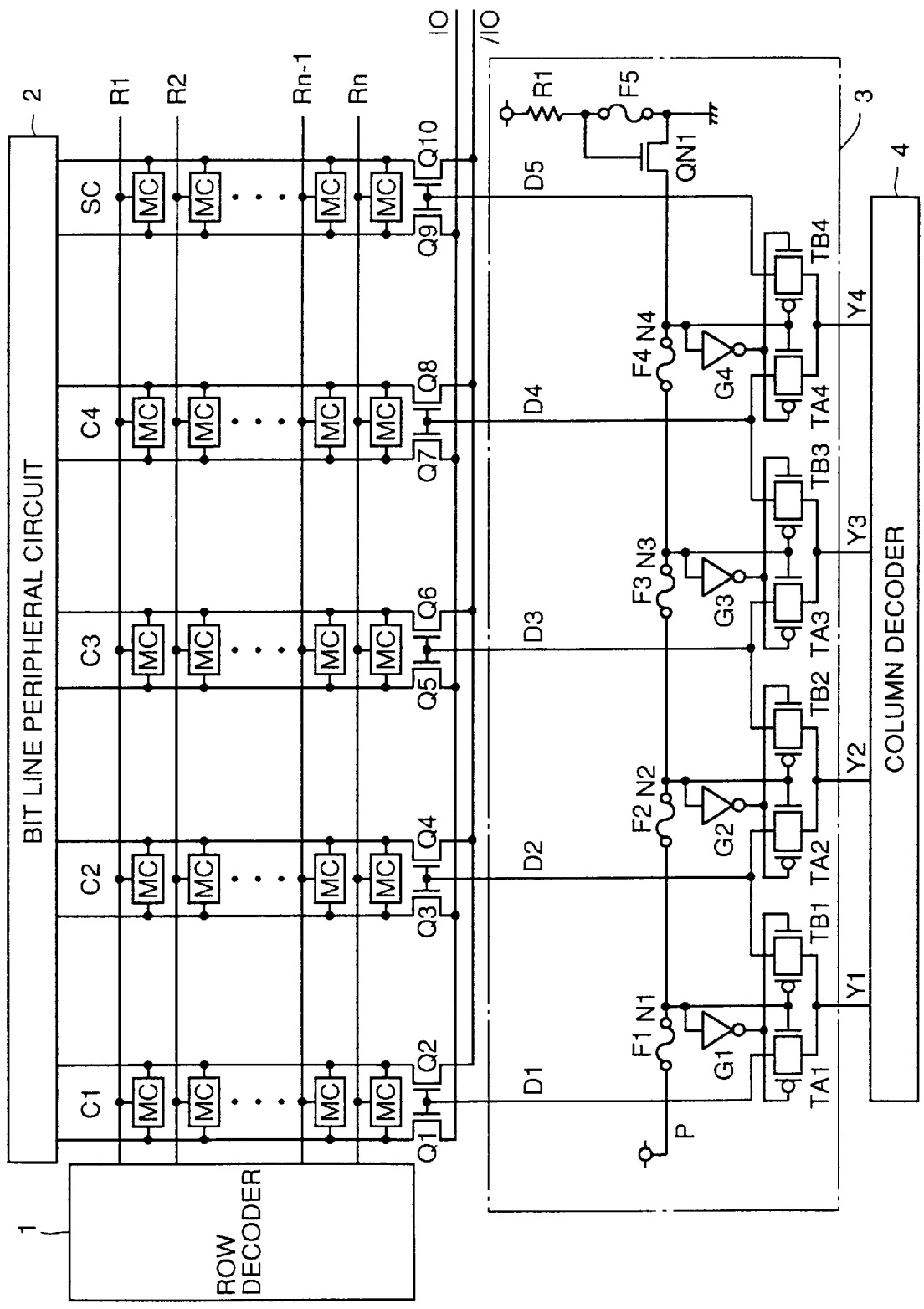
FIG. 2 is a diagram showing an arrangement of a tag memory located in a tag memory region shown in FIG. 1.

A tag memory placed in the tag memory region shown in FIG. 1 will now be described. FIG. 2 is a diagram showing an arrangement of a tag memory placed in the tag memory region shown in FIG. 1. Although four normal columns C1–C4 and one spare (redundant) column SC are shown for convenience in FIG. 2, the number of columns is not limited to this.

Referring to FIG. 2, a tag memory includes a row decoder 1, a bit line peripheral circuit 2, a column repairing circuit 3, a column decoder 4, memory cells MC, columns C1–C4, SC, rows (word lines) R1–Rn, NMOS transistors Q1–Q10 serving as transfer gates, and data I/O lines IO, /IO. Since row decoder 1, bit line peripheral circuit 2, and column decoder 4 are similar to those used in a conventional semiconductor memory device, detailed description thereof will not be repeated.

Column repairing circuit 3 includes fuses F1–F5, transmission gates TA1–TA4, TB1–TB4 constituted by PMOS and NMOS transistors, inverters G1–G4, an NMOS transistor QN1, and a resistance R1.

Respective gates of transistors Q1 and Q2 are connected to transmission gate TA1. Respective gates of transistors Q3 and Q4 are connected to both transmission gates TB1 and TA2. Transmission gates TA1 and TB1 are connected to column decoder 4. One end of fuse F1 is connected to a power supply voltage $V_{cc}$. The other end of fuse F1 is connected to a gate of an NMOS transistor of transmission gate TA1 and a gate of a PMOS transistor of transmission gate TB1, and further connected through inverter G1 to a gate of a PMOS transistor of transmission gate TA1 and a gate of an NMOS transistor of transmission gate TB1. Fuses F2–F4, inverters G2–G4, and transmission gates TA2–TA4, TB2–TB4 are connected in a manner similar to that described above. One end of fuse F4 is connected to NMOS transistor QN1. NMOS transistor QN1 is connected to a ground potential $V_{ss}$. One end of resistance R1 is connected to power supply voltage $V_{cc}$ and the other end thereof is connected to fuse F5. A connection point between resistance R1 and one end of fuse F5 is connected to the gate of NMOS transistor QN1. The other end of fuse F5 is connected to ground potential $V_{ss}$.

An operation of a column repairing circuit having the above described structure will now be described. Transmission gates TA1–TA4, TB1–TB4 connect output signal lines Y1–Y4 of column decoder 4 to columns C1–C4, SC, respectively, so that a column including a defective memory cell (a defective column) is not selected. A voltage supply path P is grounded in order to control transmission gates TA1–TA4, TB1–TB4. Voltage supply path P has its one end connected to power supply voltage $V_{cc}$ and the other end connected to the drain of NMOS transistor QN1. Fuses F1–F4 corresponding to columns C1–C4, respectively, are placed in series between one end of voltage supply path P and NMOS transistor QN1. The gate of NMOS transistor QN1 is connected to power supply voltage $V_{cc}$ through resistance R1 as well as to ground potential $V_{ss}$ through fuse F5. The source of NMOS transistor QN1 is connected to ground potential $V_{ss}$. Resistance R1 is set to such a value that little current would flow from the power supply to the ground when fuse F5 is conductive.

When there is no defective memory cell, fuses F1–F5 are all conductive. In this condition, NMOS transistor QN1 is off. Consequently, since power supply path P is set to be at a power supply voltage $V_{cc}$ level, nodes N1–N4 are all at an "H" level. Therefore, transmission gates TA1–TA4 are turned on. In the meantime, transmission gates TB1–TB4 are turned off. As a result, output signal lines Y1–Y4 of column decoder 4 are connected to columns C1–C4 through transmission gates TA1–TA4, respectively.

A case in which a defective memory cell exists on column C2 will now be considered. In this case, fuse F2 corresponding to column C2 as well as fuse F5 are disconnected. As a result, NMOS transistor QN1 is turned on. Accordingly, potential at node N1 is set to be at an "H" level, and potentials at nodes N2–N4 are set to be at an "L" level. Consequently, transmission gates TA1, TB2–TB4 are turned on, and transmission gates TA2–TA4, TB1 are turned off. Therefore, output signal line Y1 of column decoder 4 is connected to column Cl through transmission gate TA1, and other output signal lines Y2–Y4 are connected to columns C3, C4, SC through transmission gates TB2–TB4, respectively. Thus, a column including a defective memory cell can be repaired. Furthermore, little access penalty is caused by defective repair in this case.

Data memory region DMAa shown in FIG. 1 is divided into a plurality of memory blocks. Although the data memory region is divided into eight memory blocks in FIG. 1, the present invention is not limited to this. One or more redundant rows are provided in each memory block for repairing a defective portion of data memory region DMAa. In addition, one or more redundant columns are provided at one place in the data memory. Although the redundant column is located in the center of the data memory region in FIG. 1, the present invention is not limited to this. A repairing method in the data memory region is desired to have high repairing efficiency. For example, a repairing method allowing repair of a defective memory cell in one memory block with a redundant memory cell in another block is desirable. In this repairing method, since a logic thereof is complicated, access penalty is larger than in the case of shift redundancy. However, even if defects are produced intensively in one memory block, they can be repaired using redundant memory cells of other memory blocks, achieving higher repairing efficiency.

Figure 3:
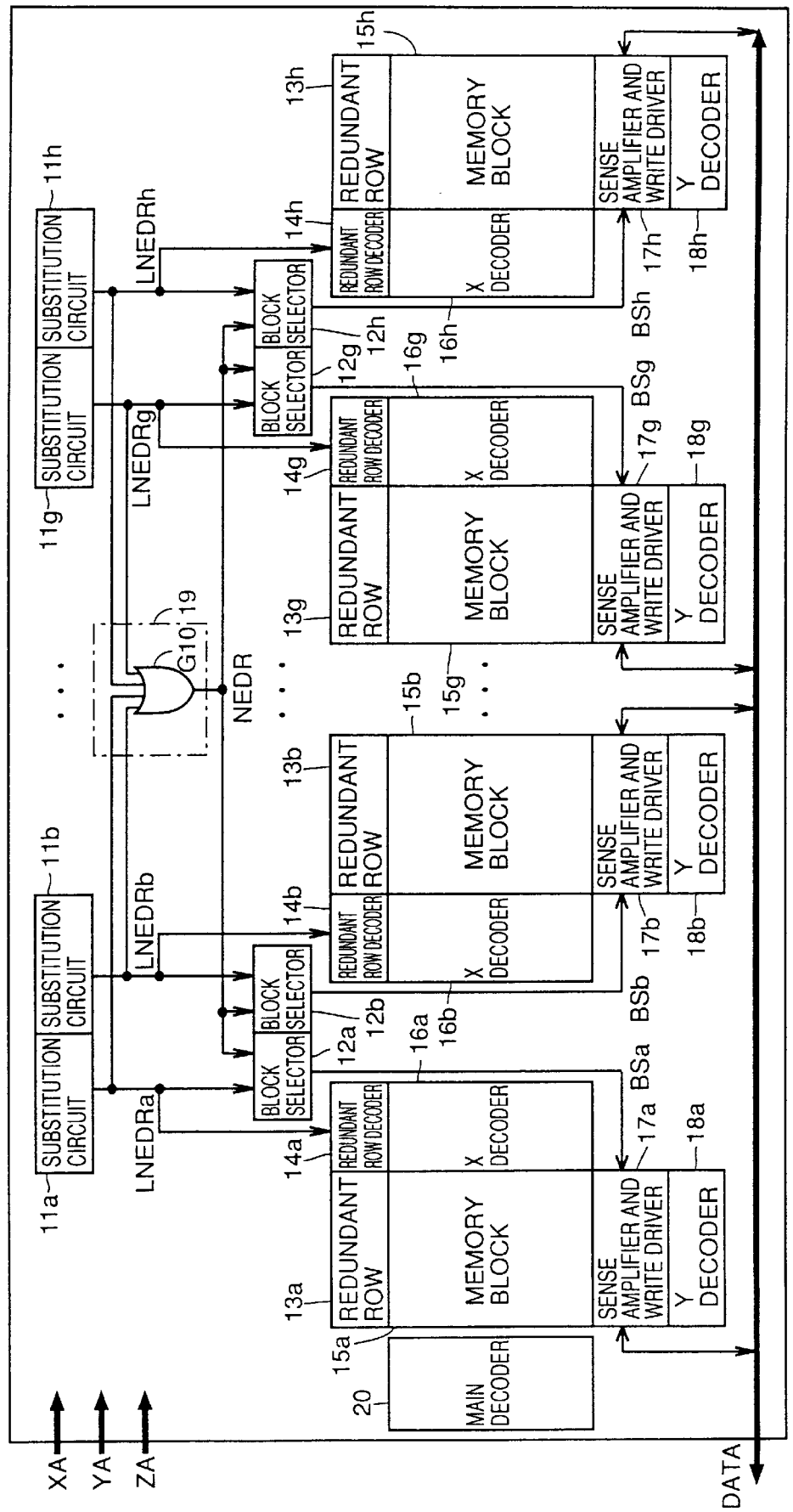
FIG. 3 is a diagram showing a first arrangement of a data memory located in a data memory region shown in FIG. 1.

A data memory located in the data memory region shown in FIG. 1 will now be described in further detail. FIG. 3 is a diagram showing a first arrangement of a data memory located in the data memory region shown in FIG. 1. A method of repairing a defective memory cell by a redundant row in the data memory region is illustrated in FIG. 3.

Referring to FIG. 3, a data memory includes substitution circuits 11a–11h, block selectors 12a–12h, redundant rows 13a–13h, redundant decoders 14a–14h, memory blocks 15a–15h, X decoders 16a–16h, sense amplifier and write drivers 17a–17h, Y decoders 18a–18h, a normal memory cell non-selection circuit 19, and a main decoder 20.

As shown in FIG. 3, the data memory region is divided into eight memory blocks 15a–15h. One normal memory cell non-selection circuit 19 and eight substitution circuits 11a–11h corresponding to respective memory blocks are provided.

Figure 4:
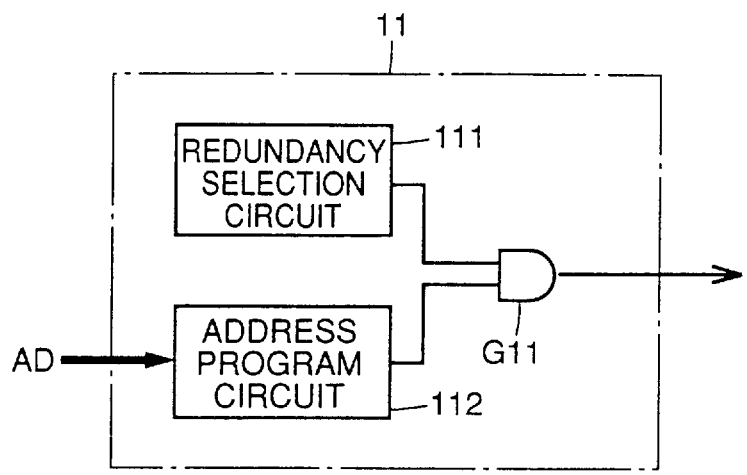
FIG. 4 is a diagram showing an arrangement of a substitution circuit shown in FIG. 3.

The substitution circuit shown in FIG. 3 will now be described. FIG. 4 is a diagram showing an arrangement of the substitution circuit shown in FIG. 3. Referring to FIG. 4, substitution circuit 11 includes a redundancy selection circuit 111, an address program circuit 112, and an AND circuit G11. An address signal AD is input to address program circuit 112. Redundancy selection circuit 111 and address program circuit 112 are connected to AND circuit G11. AND circuit G11 outputs a logical product of two input signals as an output signal.

Figure 5:
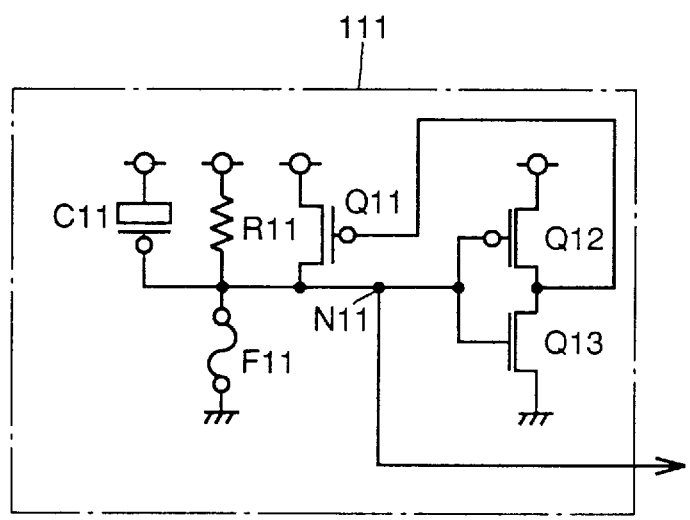
FIG. 5 is a circuit diagram showing an arrangement of a redundancy selection circuit shown in FIG. 4.

The redundancy selection circuit shown in FIG. 4 will now be described in more detail. FIG. 5 is a circuit diagram showing an arrangement of the redundancy selection circuit shown in FIG. 4. Referring to FIG. 5, redundancy selection circuit 111 includes an MOS capacitor C11, a high resistance R11, a fuse F11, PMOS transistors Q11, Q12, and an NMOS transistor Q13.

MOS capacitor C11 has its one end connected to a power supply voltage $V_{cc}$ and the other end connected to one end of fuse F11. Each of high resistance R11 and transistor Q11 is connected in a similar manner to that of MOS capacitor C11. The other end of fuse F11 is connected to a ground potential $V_{ss}$. Transistor Q12 has its one end connected to power supply voltage $V_{cc}$ and the other end connected to one end of transistor Q13. The other end of transistor Q13 is connected to ground potential $V_{ss}$. The gate of transistor Q11 is connected to a connection point between transistors Q12 and Q13. Respective gates of transistors Q12 and Q13 are connected to one end of fuse F11.

When redundancy is not selected, fuse F11 is in a connected state, and therefore, a potential at a node N11 is at a ground level. On the other hand, when redundancy is selected, fuse F11 is disconnected. If a power supply is turned on at this time, a potential at node N11 rises towards an "H" level due to current flowing into high resistance R11, provided that a power supply voltage increases gradually. Furthermore, a positive feedback circuit constituted by transistors Q11–Q13 causes the potential at node N11 to attain an "H" level completely. Thus, an output signal of redundancy selection 111 falls to an "L" level when redundancy is not selected, and goes to an "H" level when redundancy is selected.

Figure 6:
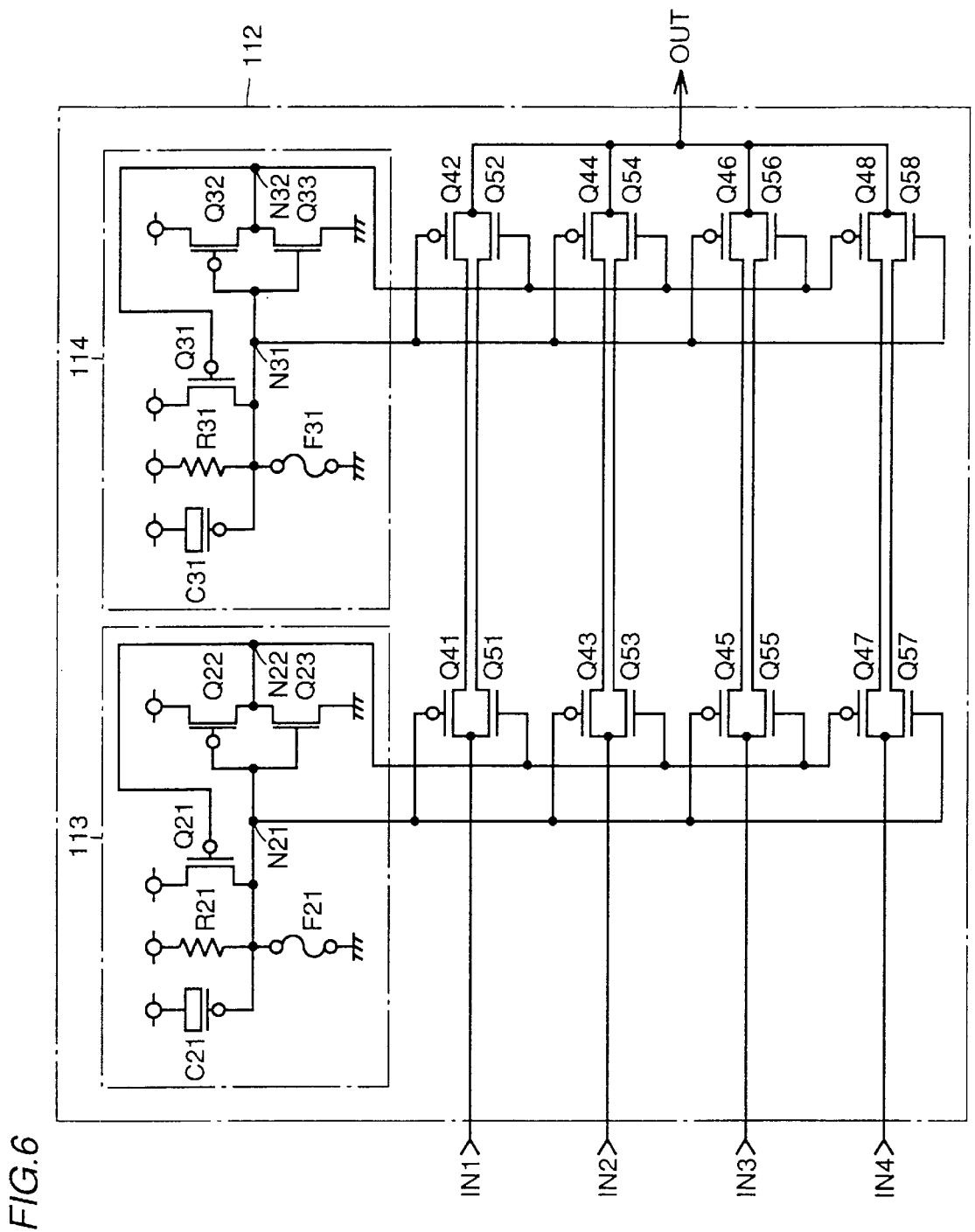
FIG. 6 is a circuit diagram showing an arrangement of an address program circuit shown in FIG. 4.

The address program circuit shown in FIG. 4 will now be described in more detail. FIG. 6 is a circuit diagram showing an arrangement of the address program circuit shown in FIG. 4.

Referring to FIG. 6, address program circuit 112 includes selection circuits 113, 114, PMOS transistors Q41–Q48, and NMOS transistors Q51–Q58.

Selection circuit 113 includes an MOS capacitor C21, a high resistance R21, PMOS transistors Q21, Q22, a fuse F21, and an NMOS transistor Q23. Selection circuit 114 includes an MOS capacitor C31, a high resistance R31, PMOS transistors Q31, Q32, a fuse F31, and an NMOS transistor Q33. Since arrangement and operation of selection circuits 113 and 114 are similar to those of redundancy selection circuit 111 shown in FIG. 5, description thereof will not be repeated.

An input signal IN1 is input to transistors Q41 and Q51. An output signal of a node N21 is input to the gate of transistor Q41. A signal of a node N22 is input to the gate of transistor Q51. Transistor Q41 is connected to transistor Q42 at one end. Transistor Q51 is connected to transistor Q52 at one end. Transistors Q42 and Q52 are connected together at the other end, and an output signal OUT is output therefrom. An output signal of a node N31 is input to the gate of transistor Q42. An output signal of a node N32 is input to the gate of transistor Q52. Transistors Q45, Q46, Q55, and Q56 are connected to each other in a similar manner to that described above. Furthermore, transistors Q43, Q53, Q44, and Q54 are connected to each other in approximately the same manner as described above, and thus, an output signal of node N22 is input to a gate of transistor Q43, an output signal of node 21 is input to the gate of transistor Q53, an output signal of node N31 is input to the gate of transistor Q44, and an output node N32 is input to the gate of transistor Q54. The same is applied to transistors Q47, Q57, Q48, and Q58.

A programming method in an address program circuit having the above described structure will now be described. It is assumed that predecode signals X0·X1, X0·/X1, /X0·X1, /X0·X1 are input as input signals IN1–IN4, respectively. When fuses F21 and F31 are each in a connected state, potentials at nodes N21 and N31 are at an "L" level, and potentials at nodes N22 and N32 are at an "H" level. Accordingly, only an input signal IN1 is output as an output signal OUT. That is, predecode signal X0·X1 is output as an output signal OUT. For example, when both X0 and X1 are at an "H", output signal OUT is at an "H" level, whereby an address of X0=X1="H" is programmed by fuses F21 and F31. Similarly, when fuse F21 is disconnected and fuse F31 is in a connected state, an addresses of X0="H", X1="L" is programmed. When fuse F21 is in a connected state and fuse F31 is disconnected, an address of X0="L", X1="H" is programmed. In addition, when fuses F21 and F31 are each disconnected, an address of X0=X1="L" is programmed. In fact, since there are at least two addresses to be programmed, a plurality of address program circuits, one of which is shown in FIG. 6, are provided, and outputs thereof are input to AND circuit G11 shown in FIG. 4.

Thus, when redundancy is not selected, substitution circuit 11 outputs an "L" level signal. On the other hand, when redundancy is selected, substitution circuit 11 outputs an "H" level signal only if an address decode signal input to substitution circuit 11 matches an address preprogrammed by address program circuit 112, and outputs an "L" level signal if not.

Referring back to FIG. 3, X decoders 16a–16h, Y decoders 18a–18h, sense amplifier and write drivers 17a–17h, redundant row decoders 14a–14h, and redundant rows 13a–13h are provided corresponding to memory blocks 15a–15h, respectively. Main decoder 20 is further provided.

Main decoder 20 decodes an externally applied X address signal XA, and applies the decoded signal to X decoders 16a–16h. Block selectors 12a–12h generate block selecting signals BSa–BSh, respectively, in response to an externally applied Z address signal (block address signal) ZA. Each of X decoders 16a–16h selects one word line in a corresponding memory block in response to a corresponding block selecting signal and an output signal of main decoder 20. Each of Y decoders 18a–18h selects one or more bit line pairs in a corresponding memory block in response to an externally applied Y address signal YA.

Redundant word line activating signals LNEDRa–LNEDRh output from substitution circuits 11a–11h are applied to redundant row decoders 14a–14h and block selectors 12a–12h, respectively. For example, redundant word line activating signal LNEDRa output from substitution circuit 11a is applied to redundant row decoder 14a and block selector 12a.

All the redundant word line activating signals LNEDRa–LNEDRh output from substitution circuits 11a–11h, respectively, are applied to a normal memory cell non-selection circuit 19. Normal memory cell non-selection circuit 19 includes an OR circuit G10. A decoder deactivating signal NEDR output from normal memory cell non-selection circuit 19 is applied to all the block selectors 12a–12h and X decoders 16a–16h.

First, description of an example in which none of redundant rows 13a–13h is used (condition in which redundancy is not selected) will be given. In this case, redundant word line activating signals LNEDRa–LNEDRh are at an "L" level. As a result, a decoder deactivating signal NEDR output from normal memory cell non-selection circuit 19 falls to an "L" level. Therefore, block selectors 12a–12h are rendered active. At this time, all the redundant row decoders 14a–14h are in a non-selected state.

One of block selecting signals BSa–BSh attains an "H" level (a selected state) in response to a Z address signal ZA. For example, if block selecting signal BSa attains an "H" level, X decoder 16a is set in a selected state, and sense amplifier and write driver 17a is rendered active. X decoder 16a selects one word line in memory block 15a, and causes a potential at the word line to rise to an "H" level. As a result, data is read out from a memory cell connected to the selected word line to a corresponding bit line pair. Y decoder 18a selects one or more bit line pairs in memory block 15a.

In read operation, a sense amplifier in sense amplifier and write driver 17a is activated. As a result, data on a selected bit line pair is amplified by the sense amplifier, and then, is output externally as data. In write operation, a write driver in sense amplifier and write driver 17a is activated. As a result, externally applied data is transmitted to a selected bit line pair, and the data is written to a memory cell connected to a selected word line.

Description of an example in which any redundant row is used will now be given. In this case, any one of redundant word line activating signals LNEDRa–LNEDRh is at an "H" level. It is now assumed that a word line including a defective memory cell produced in memory block 15h is repaired by redundant row 13a.

An address (substitute address) of a word line to be substituted in memory block 15h is preprogrammed in the address program circuit of substitution circuit 11a.

If an address designated by an X address signal XA and a Z address signal ZA matches a substitute address (i.e., an address of a word line including a defective memory cell in memory block 15h) programmed in the address program circuit in substitution circuit 11a, redundant word line activating signal LNEDRa attains an "H" level. Therefore, decoder deactivating signal NEDR also attains an "H" level. As a result, all the X decoders 16a–16h are rendered inactive.

Z address signal ZA originally selects memory block 15h. However, since decoder deactivating signal NEDR is at an "H" level, block selecting signal BSh falls to an "L" level, and sense amplifier and write driver 17h is rendered inactive. On the other hand, since redundant word line activating signal LNEDRa is at an "H" level, block selecting signal BSa attains an "H" level, and sense amplifier and write driver 17a is rendered active. Furthermore, since redundant word line activating signal LNEDRa is at an "H" level, redundant row decoder 14a is rendered active. Therefore, a redundant word line is selected, and a potential at the redundant word line attains an "H" level. As a result, data is read out from a memory cell connected to the selected redundant word line to a bit line pair. Y decoder 18a selects a bit line pair within memory cell array block 15a.

In read operation, a sense amplifier in sense amplifier and write driver 17a is activated. As a result, data on a selected bit line pair is amplified by the sense amplifier, and then, is output externally as data. In write operation, a write driver in sense amplifier and write driver 17a is activated. As a result, externally applied data is transmitted to a selected bit line pair, and the data is written to a memory cell connected to a selected redundant word line.

Thus, a redundant word line in an arbitrary memory block can be substituted for a word line in each memory block, and therefore, even if defects are produced intensively in one block, they can be repaired by redundant word lines in other blocks. Therefore, high repairing efficiency can be obtained in a data memory shown in FIG. 3.

Figure 7:
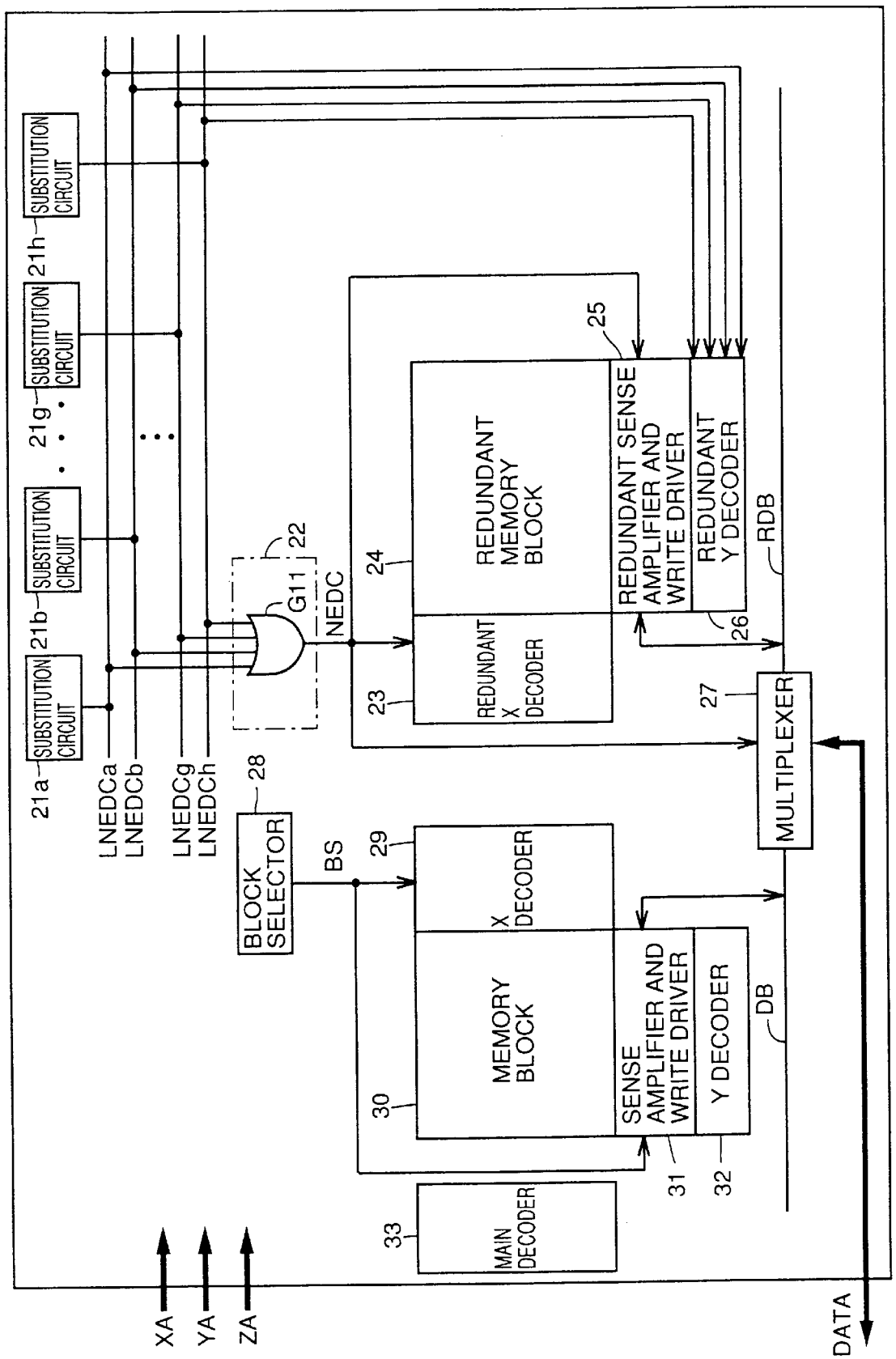
FIG. 7 is a diagram showing a second arrangement of a data memory located in a data memory region shown in FIG. 1.

A method of repairing a defective memory cell by a redundant column in a data memory will now be described. FIG. 7 is a diagram showing a second arrangement of a data memory placed in the data memory region shown in FIG. 1. In the data memory shown in FIG. 7, a plurality of redundant columns are provided at one place as a redundant memory block as in the case of the data memory shown in FIG. 1.

Referring to FIG. 7, the data memory includes a substitution circuit 21a–21h, a redundant memory block selection circuit 22, a redundant X decoder 23, a redundant memory block 24, a redundant sense amplifier and write driver 25, a redundant Y decoder 26, a multiplexer 27, a block selector 28, an X decoder 29, a memory block 30, a sense amplifier and write driver 31, a Y decoder 32, and a main decoder 33.

The number of substitution circuits 21a–21h corresponds to that of the redundant columns, and arrangement and operation of the substitution circuit are similar to those of the substitution circuit shown in FIG. 4. In this case, since the number of the redundant columns is eight, eight substitution circuits are provided. In FIG. 7, only one block of a plurality of normal memory blocks is shown. The following is the description of the case in which a defective memory cell of this normal memory block is repaired by a redundant column of a redundant memory block.

X decoder 29, Y decoder 32, and sense amplifier and write driver 31 are provided corresponding to memory block 30. In addition, redundant X decoder 23, redundant Y decoder 26, and redundant sense amplifier and write driver 25 are provided corresponding to redundant memory block 24. Main decoder 33 and multiplexer 27 are further provided.

Main decoder 33 decodes an externally applied X address signal XA, and applies the decoded signal to X decoder 29 and redundant X decoder 23. Block selector 28 generates a block selecting signal BS in response to an externally applied Z address signal (block address signal) ZA. X decoder 29 selects one word line in memory block 30 in response to the block selecting signal BS and the output signal of main decoder 33. Y decoder 32 selects one or more bit line pairs in a corresponding memory block in response to an externally applied Y address signal YA.

Substitution circuits 21a–21h output redundant column activating signals LNEDCa–LNEDCh, respectively, in response to externally applied Y address signal YA and Z address signal ZA. All the redundant column activating signals LNEDCa–LNEDCh output from substitution circuits 21a–21h, respectively, are applied to redundant Y decoder 26 and redundant memory block selection circuit 22. Redundant memory block selection circuit 22 includes an OR circuit G11. A redundant memory block selecting signal NEDC output from redundant memory block selection circuit 22 is applied to redundant X decoder 23, redundant sense amplifier and write driver 25, and multiplexer 27.

First, description of the case in which none of redundant columns is used (condition in which redundancy in not selected) will be given. In this case, redundant column activating signals LNEDCa–LNEDCh are at an "L" level. Accordingly, a redundant memory block selecting signal NEDC output from redundant memory block selection circuit 22 is at an "L" level. As a result, redundant X decoder 23 is in a non-selected state.

When a block selecting signal BS attains an "H" level in response to a Z address signal ZA, X decoder 29 is set in a selected state, and sense amplifier and write driver 31 is rendered active. X decoder 29 selects one word line in memory block 30 and causes a potential at the word line to rise to an "H" level. As a result, data is read out from a memory cell connected to the selected word line to a corresponding bit line pair. Y decoder 32 selects one or more bit line pair in memory block 30.

In read operation, a sense amplifier in sense amplifier and write driver 31 is activated. As a result, data on a selected bit line pair is amplified by the sense amplifier, and then, is output to a normal data bus DB. If redundant memory block selecting signal NEDC is at an "L" level, normal data bus DB is selected by multiplexer 27, and data is output externally therethrough.

In write operation, a write driver in sense amplifier and write driver 31 is activated. If redundant memory block selecting signal NEDC is at an "L" level, normal data bus DB is selected by multiplexer 27, externally applied data is transmitted to a selected bit line pair therethrough, and the data is written to a memory cell connected to a selected word line.

Description of the case in which any redundant column is used will now be given. In this case, any one of redundant column activating signals LNEDCa–LNEDCh is at an "H" level. It is now assumed that an address (substitute address) of a column to be substituted in memory block 30 is preprogrammed in the address program circuit in substitution circuit 21a. If an address designated by a address signal YA and a Z address signal ZA matches a substitute address (i.e., an address of a column including a defective memory cell in memory block 30) programmed in the address program circuit in substitution circuit 21a, redundant column activating signal LNEDCa attains an "H" level. Accordingly, redundant block activating signal NEDC also attains an "H" level. As a result, redundant X decoder 23 and redundant sense amplifier and write driver 25 are rendered active.

Redundant X decoder 23 selects one word line within redundant memory block 24 and causes a potential at the word line to rise to an "H" level. As a result, data is read out from a memory cell connected to the selected word line to a corresponding bit line pair. Redundant Y decoder 26 selects a bit line pair corresponding to redundant column activating signal LNEDCa. Then, data of the selected bit line pair is amplified by a sense amplifier, and is output to a redundant data bus RDB. If redundant block activating signal NEDC is at an "H" level, redundant data bus RDB is selected by multiplexer 27 and data is output externally therethrough.

Thus, a defective memory cell in a memory block can be repaired by a redundant column in a redundant memory block.

Figure 8:
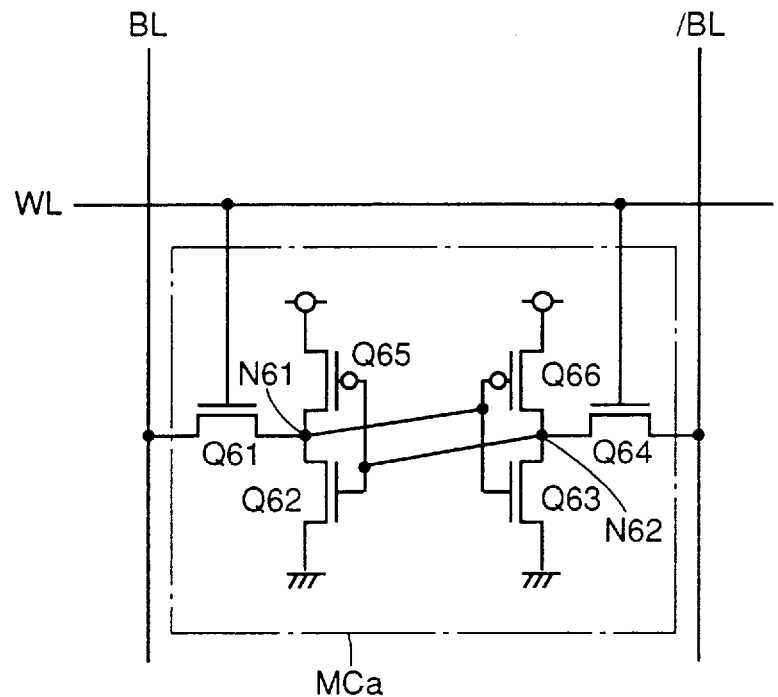
FIG. 8 is a diagram showing an arrangement of a memory cell used for a tag memory.

A memory cell used in a tag memory and a data memory will now be described. FIG. 8 is a diagram showing an arrangement of a memory cell used in the tag memory, and FIG. 9 is a diagram showing an arrangement of a memory cell used in the data memory.

Referring to FIG. 8, a memory cell MCa includes an NMOS transistor Q61–Q64 and a PMOS transistor Q65, Q66. Transistor Q61 has its one end connected to a bit line BL and the other end connected to one end of each of transistors Q65 and Q62. The other end of transistor Q65 is connected to a power supply voltage $V_{cc}$. The other end of transistor Q62 is connected to a ground potential $V_{ss}$. Transistor Q64 has its one end connected to a bit line /BL complementary to a bit line BL, and the other end connected to one end of each of transistors Q66 and Q63. The other end of transistor Q66 is connected to power supply voltage $V_{cc}$. The other end of transistor Q63 is connected to ground potential $V_{ss}$. Respective gates of transistors Q61 and Q64 are connected to a word line WL. Respective gates of transistors Q65 and Q62 are connected to a connection point between transistors Q66 and Q63. Respective gates of transistors Q66 and Q63 are connected to a connection point between transistors Q65 and Q62. Thus, a full CMOS type memory cell is constituted.

Figure 9:
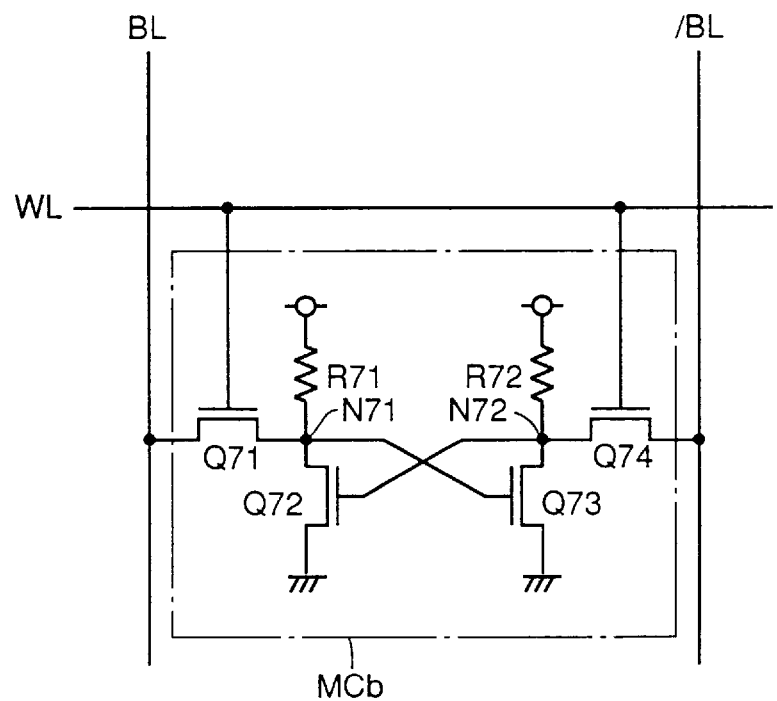
FIG. 9 is a diagram showing an arrangement of a memory cell used for a data memory.

Referring now to FIG. 9, a memory cell MCb includes NMOS transistors Q71, Q74, and high resistances R71, R72. Transistor Q71 has its one end connected to a bit line BL, and the other end connected to high resistance R71 and one end of transistor Q72. The other end of high resistance R71 is connected to a power supply voltage $V_{cc}$. The other end of transistor Q72 is connected to a ground potential $V_{ss}$. One end of transistor Q74 is connected to a bit line /BL complementary to a bit line BL. The other end of transistor Q74 is connected to high resistance R72 and one end of transistor Q73. The other end of high resistance R72 is connected to power supply voltage $V_{cc}$. The other end of transistor Q73 is connected to ground potential $V_{ss}$. Respective gates of transistors Q71 and Q74 are connected to a word line WL. A gate of transistor Q72 is connected to a connection point between high resistance R72 and transistor Q73. A gate of transistor Q73 is connected to a connection point between high resistance R71 and transistor Q72. Thus, a high resistance type memory cell is constituted.

Normally, with the same design rule, the full CMOS type memory cell shown in FIG. 8 has a disadvantage that an area twice the high resistance type memory cell shown in FIG. 9, which it has an advantage that it is more immune to a soft error and has larger margin of operating voltage. Therefore, in order to reduce soft error produced in a tag memory portion for which high data reliability is required, the full CMOS type memory cell shown in FIG. 8 is used for a tag memory. On the other hand, since a parity bit for error detection and error correction is often added in a data memory, the high resistance type memory cell shown in FIG. 9 having smaller area instead of the full CMOS type memory cell having lower (better) soft error rate is used for the data memory in order to reduce chip area. Accordingly, high data reliability can be achieved in a tag memory portion by using a full CMOS type memory cell, while high data reliability can be secured in the data memory portion by adding a parity bit for error detection and error correction. In addition, reduction in overall chip size can be achieved by using a high resistance type memory cell having smaller area for the data memory portion which occupies most of the chip area. As a result, a reliable cache memory having small chip size can be implemented.

Although memory cells of different type are used for a tag memory and a data memory, respectively, in the above described embodiment, a high resistance type memory cell can be used for both the tag memory and the data memory if a memory cell of the same type is desired to be used for them depending on a process. However, in this case, it is desired to achieve reduction in soft error in a tag memory by making area of a memory cell of the tag memory larger than that of the data memory and capacitance of storage nodes N71 and N72 of the memory cell in the tag memory larger than that of storage nodes N71 and N72 of the memory cell in the data memory.

Figure 10:
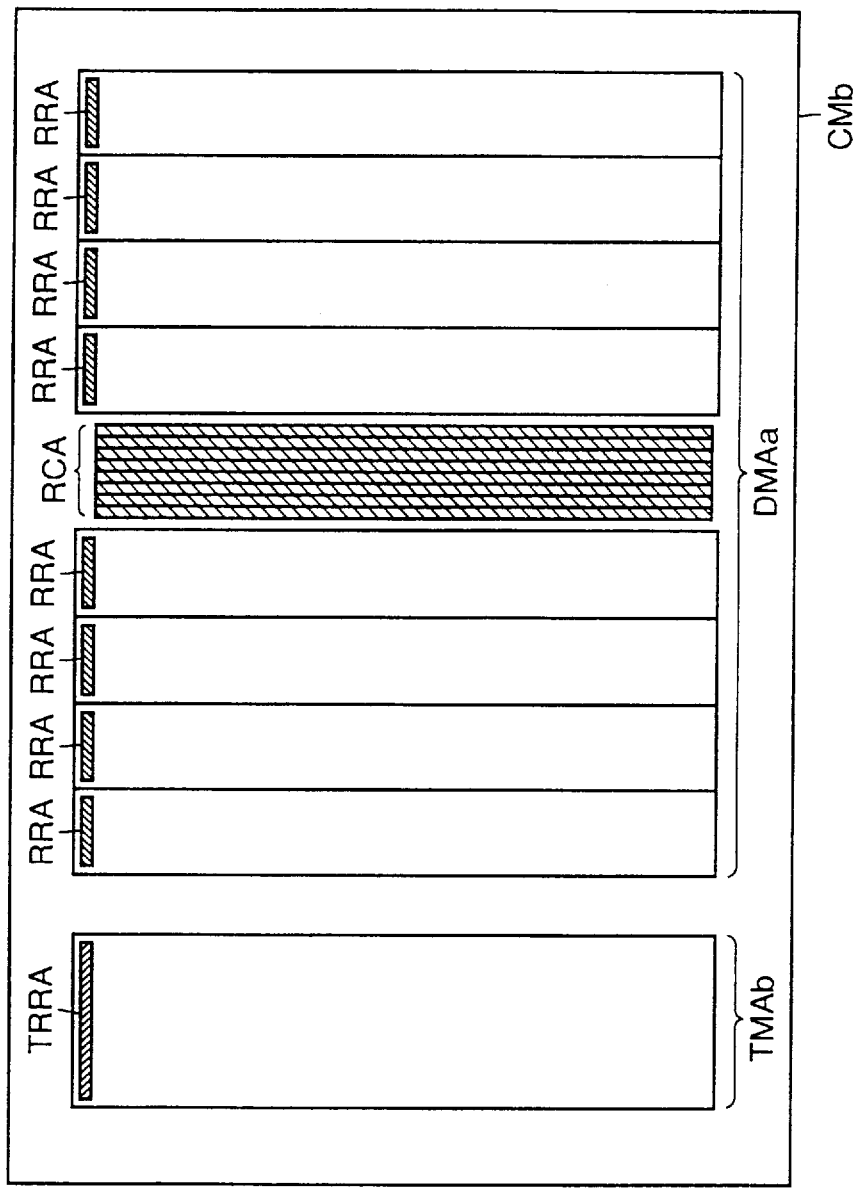
FIG. 10 is a schematic diagram showing an arrangement of a semiconductor memory device in accordance with a second embodiment of the present invention.

A semiconductor device in accordance with a second embodiment of the present invention will now be described. FIG. 10 is a schematic diagram showing an arrangement of the semiconductor memory device in accordance with the second embodiment of the present invention.

Although one or more redundant columns are provided to repair defects in a tag memory region and shift redundancy which causes little access penalty upon defect repair is used in the first embodiment, one or more redundant rows may be provided as in the case of the second embodiment shown in FIG. 10. In the second embodiment shown in FIG. 10, one or more redundant rows are provided in a redundant row region TRRA in order to repair a defective portion in a tag memory TMAb, and shift redundancy which causes little access penalty upon defect repair is used.

Figure 11:
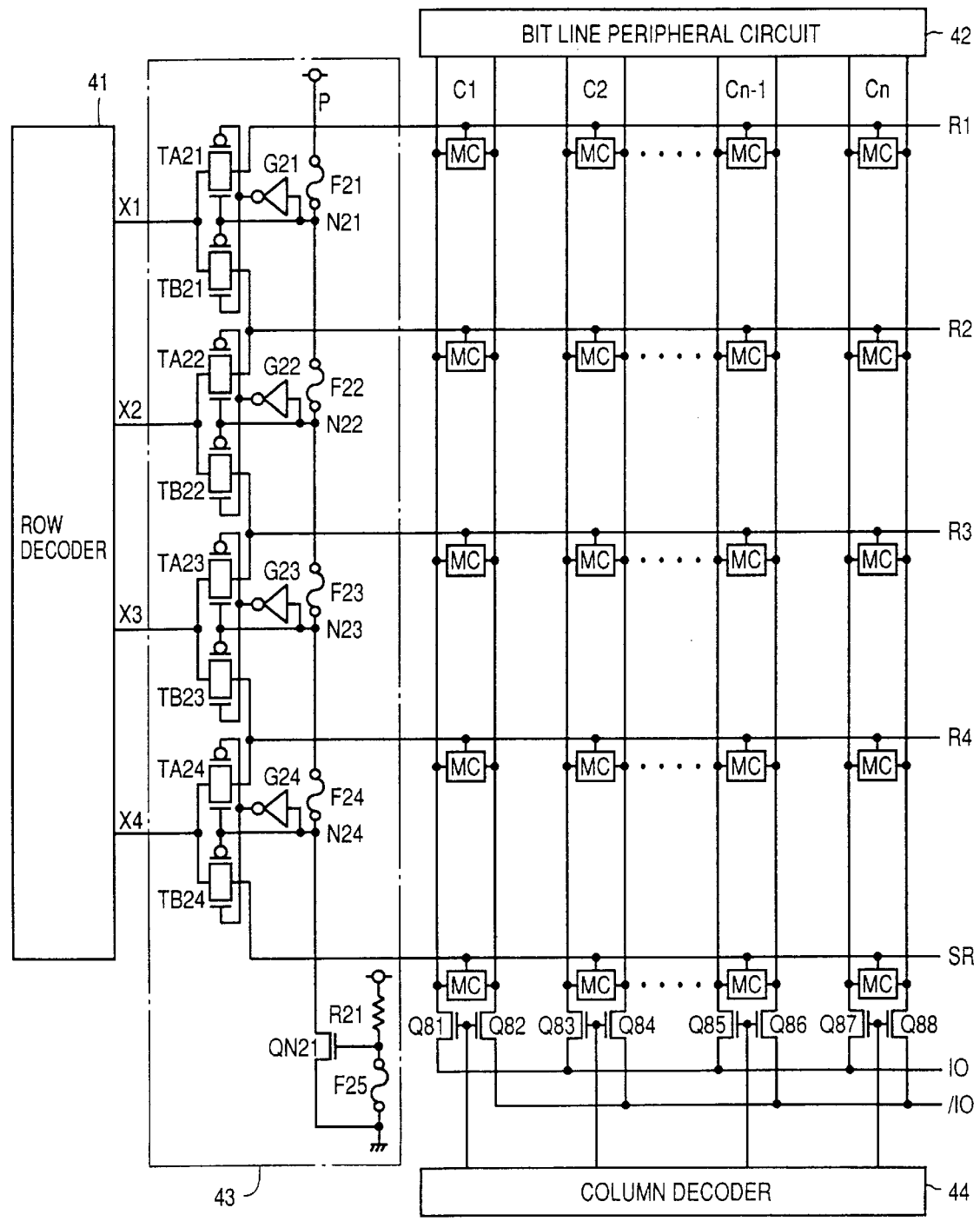
FIG. 11 is a diagram showing an arrangement of a tag memory located in a tag memory region shown in FIG. 10.

A tag memory placed in the tag memory region shown in FIG. 10 will now be described. FIG. 11 is a diagram showing an arrangement of the tag memory placed in the tag memory region shown in FIG. 10.

Referring to FIG. 11, the tag memory includes a row decoder 41, a bit line peripheral circuit 42, a row repairing circuit 43, a column decoder 44, a memory cell MC, columns C1–Cn, rows R1–R4, SR, and transfer gates Q81–Q88 constituted by NMOS transistors. Row repairing circuit 43 includes transmission gates TA21–TA24, TB21–TB24, inverters G21–G24, fuses F21–F25, a high resistance R21 and an NMOS transistor QN21.

Although the tag memory in FIG. 11 is shown to have four normal rows R1–R4 and one spare (redundant) row SR, for simplicity, the number of a normal row and a spare row is not limited to this.

The tag memory shown in FIG. 11 operates in approximately the same manner as that of the tag memory shown in FIG. 2. The tag memory 11 repairs a defect in a row direction while the tag memory shown in FIG. 2 repairs a defect in a column direction, and substantial operations thereof are approximately the same. Furthermore, a buffer may be provided in the subsequent stage to transmission gates TA21–TA24, TB21–TB24. In this case, a word line can be driven at higher speed.

Figure 12:
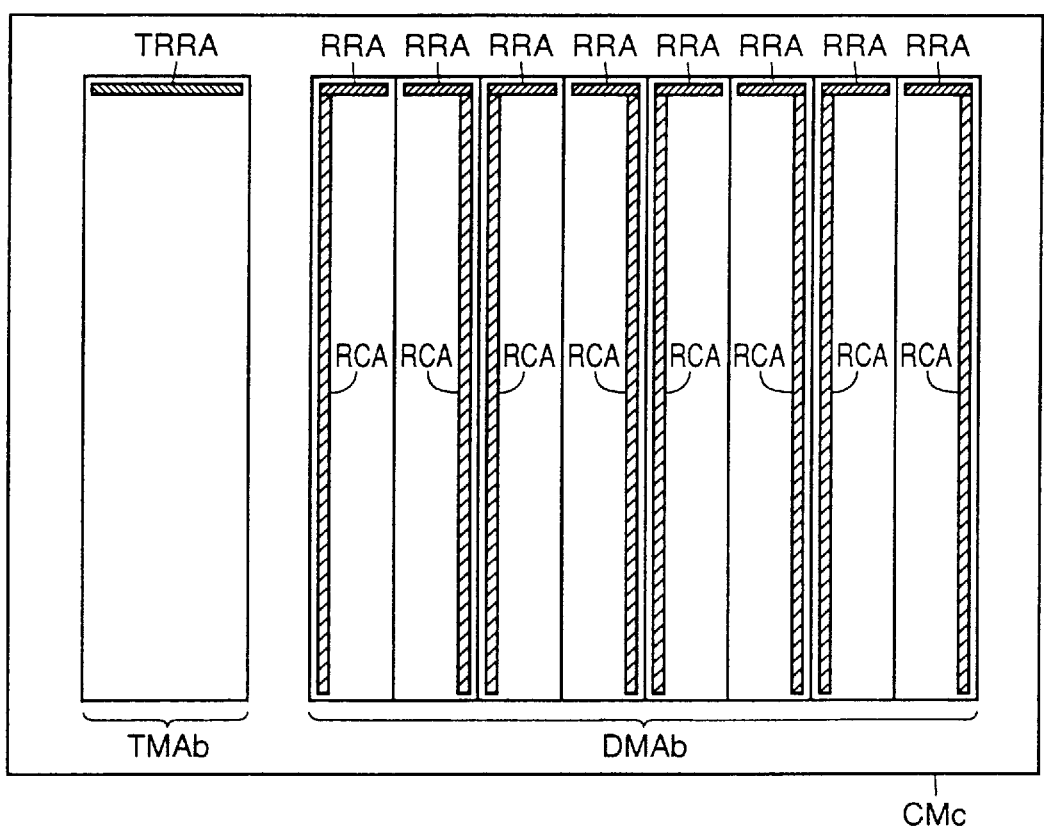
FIG. 12 is a schematic diagram showing an arrangement of a semiconductor memory device in accordance with a third embodiment of the present invention.

A semiconductor memory device in accordance with a third embodiment of the present invention will now be described. FIG. 12 is a schematic diagram showing an arrangement of the semiconductor memory device in accordance with the third embodiment of the present invention. The semiconductor memory device shown in FIG. 12 is different from the semiconductor memory device shown in FIG. 1 in that a redundant column region RCA is provided for each block in a data memory region TMAb. In this case as sell, similar effect can be obtained by using a similar circuit to that of the first embodiment.

Figure 13:
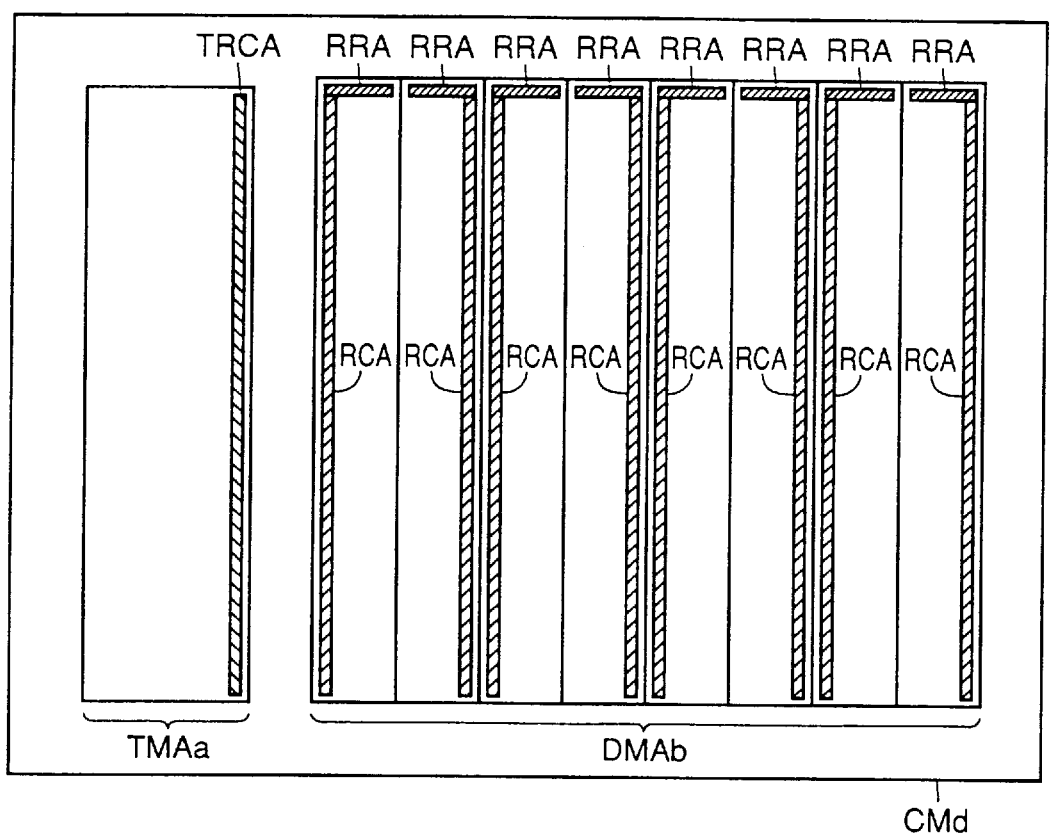
FIG. 13 is a schematic diagram showing an arrangement of a semiconductor memory device in accordance with a fourth embodiment of the present invention.
Figure 14:
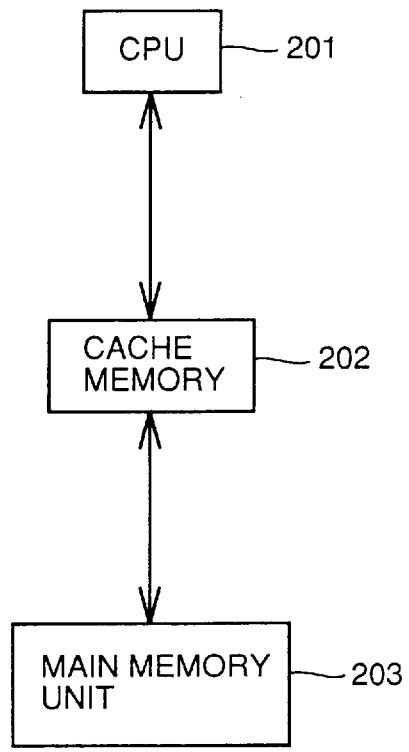
FIG. 14 is a diagram showing a hierarchical structure of a conventional memory.
Figure 15:
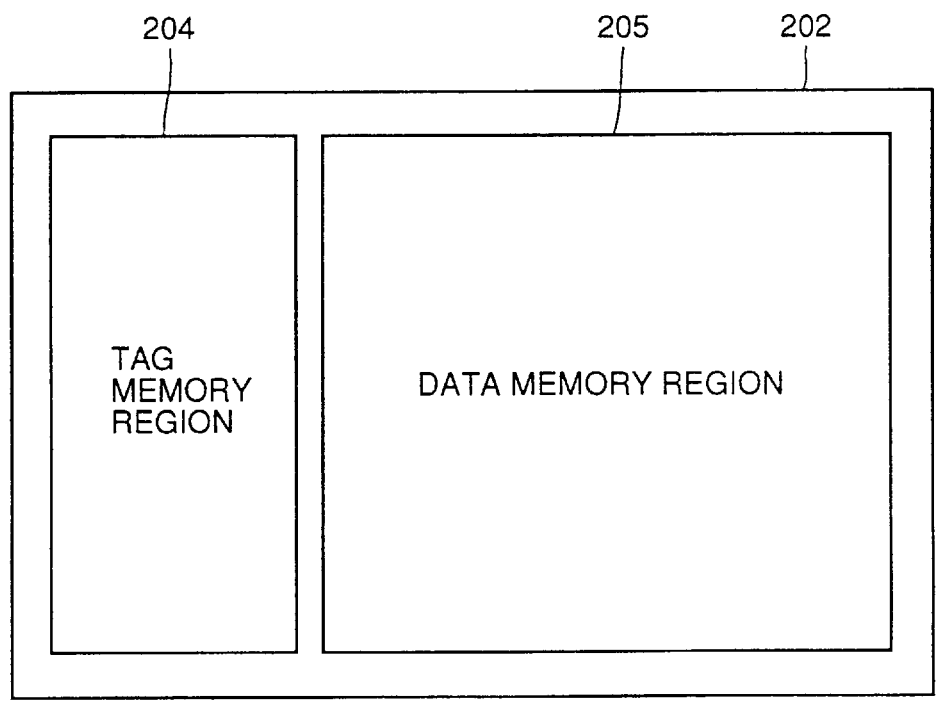
FIG. 15 is a schematic diagram showing an arrangement of a conventional semiconductor memory device.
Figure 16:
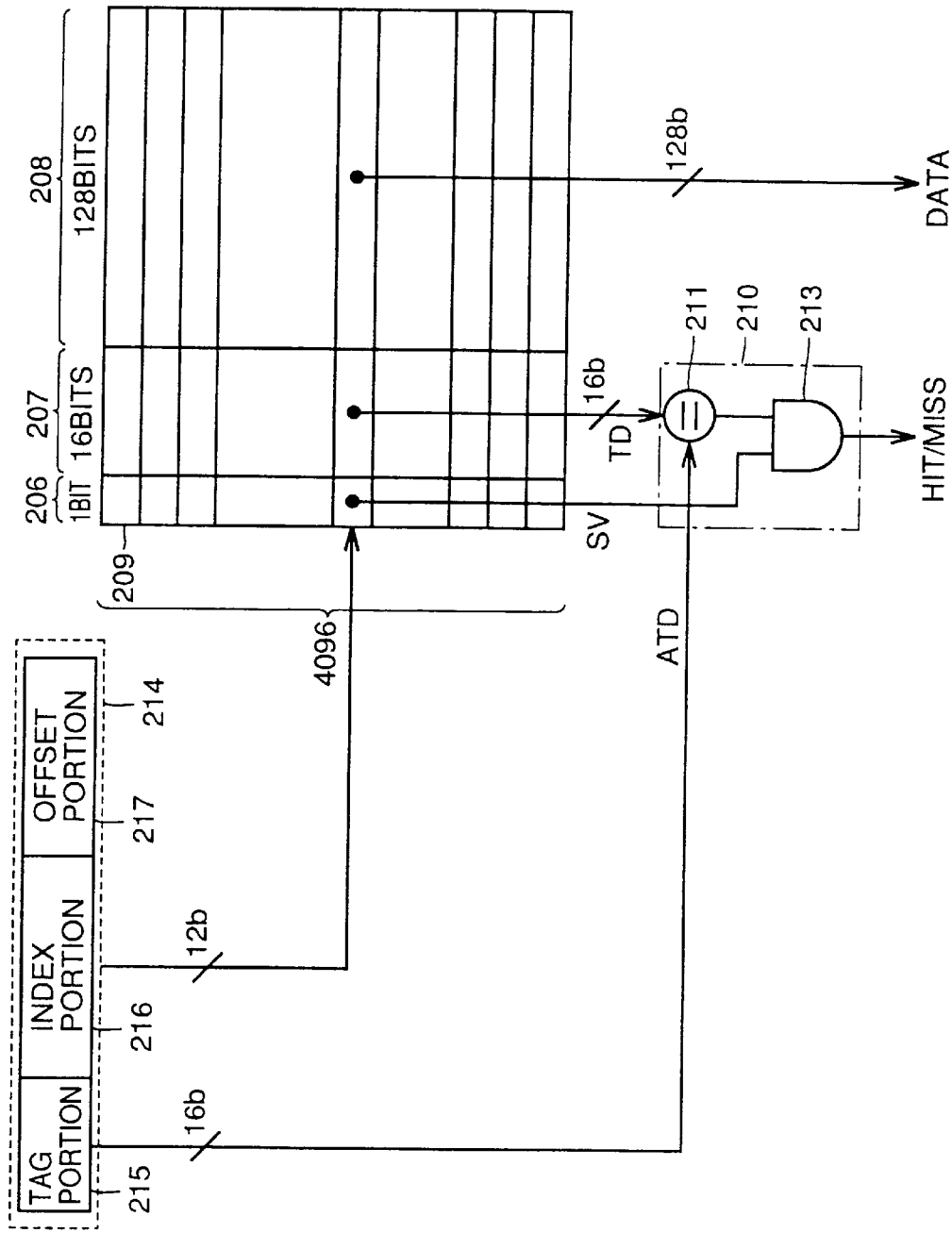
FIG. 16 is a diagram showing a logical structure of a conventional semiconductor memory device.
Figure 17:
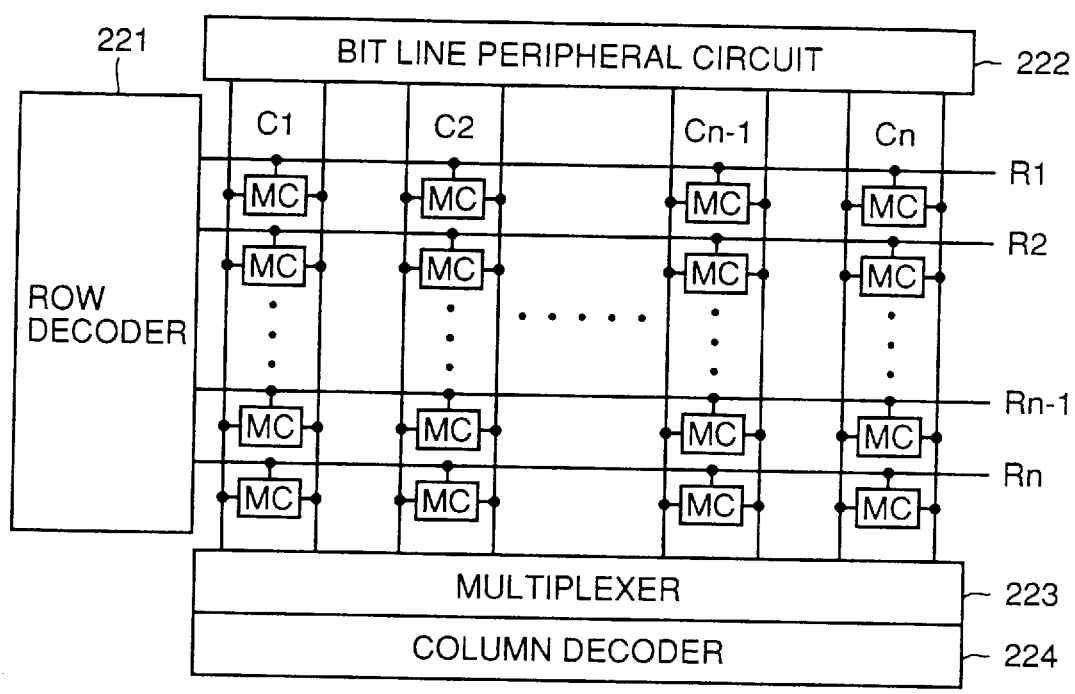
FIG. 17 is a diagram showing an arrangement of a memory block in the semiconductor memory device shown in FIG. 16.

A semiconductor memory device in accordance with a fourth embodiment of the present invention will now be described. FIG. 13 is a schematic diagram showing an arrangement of the semiconductor memory device in accordance with the fourth embodiment of the present invention. The semiconductor memory device shown in FIG. 13 is different from the semiconductor memory device shown in FIG. 10 in that a redundant column region RCA is provided for each block in a data memory region DMAb. Since other arrangement of the semiconductor memory device shown in FIG. 13 is similar to that of the semiconductor memory device shown in FIG. 10, description thereof will not be repeated. Similar effect can be obtained in the fourth embodiment as well by using a circuit similar to first and second embodiments.

Furthermore, in the third and fourth embodiments, since a data memory can be formed by repetition of the same pattern in the data memory region, yield at the time of manufacture can be improved.

In each of the above described embodiments, a repairing method causing less access penalty but having lower repairing efficiency is used for a tag memory region, while a repairing method having higher repairing efficiency but causing more access penalty is used for a data memory region, resulting in a cache memory with higher yield. Accordingly, higher yield of a tag memory, and further, higher yield of a cache memory can be achieved without making longer the access time to a tag memory than that to a data memory. In addition, improvement in reliability of a cache memory can be realized by reduction in soft error in a tag memory.

Although a cache memory has been described in the above described embodiments, similar effect can be obtained even if the present invention is similarly applied to other semiconductor memory devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including first and second memories which are integrated on a common chip and have mutually different functions, said first and second memories each having a plurality of memory cells arranged in a matrix of rows and columns, wherein, said first memory includes first repairing means for repairing a defective memory cell in said first memory by a first repairing method, and said second memory includes second repairing means for repairing a defective memory cell in said second memory by a second repairing method which is different from said first repairing method.

2. The semiconductor memory device according to claim 1, wherein said semiconductor memory device comprises a cache memory including a tag memory and a data memory, said tag memory includes said first memory, said data memory includes said second memory, said first repairing means has shorter access time at the time of repairing a defective memory cell than said second repairing means, and said second repairing means has higher repairing efficiency of a defective memory cell than said first repairing means.

3. The semiconductor memory device according to claim 2, wherein said first repairing means includes means for repairing a defective memory cell in one of row and column directions of said tag memory, and said second repairing means includes column direction repairing means for repairing a defective memory cell in a column direction of said data memory, and row direction repairing means for repairing a defective memory cell in a row direction of said data memory.

4. The semiconductor memory device according to claim 3, wherein said tag memory includes a plurality of memory cells of a first type, and said data memory includes a plurality of memory cells of a second type different from said first type.

5. The semiconductor memory device according to claim 4, wherein each memory cell of the first type has lower soft error rate than each memory cell of the second type.

6. The semiconductor memory device according to claim 5, wherein each memory cell of the first type is different in size from each memory cell of the second type.

7. The semiconductor memory device according to claim 6, wherein each memory cell of the first type has larger size than each memory cell of the second type.

8. The semiconductor memory device according to claim 1, wherein said first memory includes a plurality of memory cells of a first type, and said second memory includes a plurality of memory cells of a second type different from said first type.

9. The semiconductor memory device according to claim 8, wherein said semiconductor memory device comprises a cache memory including a tag memory and a data memory, said tag memory includes said first memory, said data memory includes said second memory, and each memory cell of the first type has lower soft error rate than each memory cell of the second type.

10. The semiconductor memory device according to claim 8, wherein each memory cell of the first type is different in size from each memory cell of the second type.

11. The semiconductor memory device according to claim 10, wherein each memory cell of the first type is larger in size and has a lower soft error rate than each memory cell of the second type.

12. A cache memory comprising a tag memory and a data memory integrated on a common chip and have mutually different functions, wherein said tag memory includes a plurality of memory cells of a first type, said data memory includes a plurality of memory cells of a second type, different from said first type, and each memory cell of the first type has lower soft error rate than each memory cell of the second type.

13. A cache memory comprising a tag memory and a data memory integrated on a common chip and have mutually different functions, wherein said tag memory includes a plurality of memory cells of a first type, said data memory includes a plurality of memory cells of a second type, different in size from each memory cell of the first type, and each memory cell of the first type has a larger size and lower soft error rate than each memory cell of the second type.

* * * * *